US011403547B2

(12) United States Patent
Irwin

(10) Patent No.: US 11,403,547 B2
(45) Date of Patent: Aug. 2, 2022

(54) TOPOLOGICAL QUANTUM COMPUTING, APPARATUS, SYSTEM AND METHOD

(71) Applicant: Klee M. Irwin, Topanga, CA (US)

(72) Inventor: Klee M. Irwin, Topanga, CA (US)

(*) Notice: Subject to any disclaimer, the term of this patent is extended or adjusted under 35 U.S.C. 154(b) by 975 days.

(21) Appl. No.: 16/128,063

(22) Filed: Sep. 11, 2018

(65) Prior Publication Data
US 2019/0080256 A1 Mar. 14, 2019

Related U.S. Application Data

(60) Provisional application No. 62/557,487, filed on Sep. 12, 2017.

(51) Int. Cl.
| | | |
|---|---|---|
| *G06N 10/00* | (2022.01) | |
| *C22C 21/00* | (2006.01) | |
| *B82Y 10/00* | (2011.01) | |
| *B82Y 30/00* | (2011.01) | |

(52) U.S. Cl.
CPC ............. *G06N 10/00* (2019.01); *C22C 21/00* (2013.01); *B82Y 10/00* (2013.01); *B82Y 30/00* (2013.01); *C22C 2200/06* (2013.01)

(58) Field of Classification Search
None
See application file for complete search history.

(56) References Cited

U.S. PATENT DOCUMENTS

| | | | |
|---|---|---|---|
| 7,969,178 B2 | 6/2011 | Przybysz et al. | |
| 2014/0354326 A1 | 12/2014 | Bonderson et al. | |
| 2016/0233965 A1 | 8/2016 | Medford | |
| 2017/0237144 A1* | 8/2017 | Tobar ................ | H03H 9/54 333/232 |

FOREIGN PATENT DOCUMENTS

EP 3082073 A1 10/2016

OTHER PUBLICATIONS

Satija, I et al. "Chern and Majorana Modes of Quasicrystals". School of Physics Astronomy and Computational Sciences, George Mason University, Oct. 2012 [retrieved on Oct. 22, 2018]. Retrieved from the Internet: <URL: https:/lpdfs.semanticscholar.org/9716/51e91435281aad7b9ea9f51e645726d884be.pdf>; 4 pages.

(Continued)

*Primary Examiner* — Evren Seven
(74) *Attorney, Agent, or Firm* — Patent Law Works LLP

(57) ABSTRACT

A quantum computer, quantum logic circuit, material for forming qubits, and method of operating a quantum computer is described. The material is formed from a quasicrystal or quasicrystalline approximant. In some examples, topological quantum computing is performed based on the quasicrystal or quasicrystalline approximant materials. Quasicrystals and quasicrystalline approximate materials have materials properties that can be adapted to perform quantum computing. In one example, the material is a Tsai-type quasicrystalline approximant with a material structure selected to permit qubits to be generated.

19 Claims, 6 Drawing Sheets
(3 of 6 Drawing Sheet(s) Filed in Color)

(56) References Cited

OTHER PUBLICATIONS

Tanaka, K, et al. "Tsai-Type Quasicrystal and Its Approximant in Au—Al—Tm Alloys". Proceedings of the 12th International Conference on Quasicrystals, 2014 [retrieved on Oct. 22, 2018]. Retrieved from the Internet: <URL: http://citeseerx.ist.psu.edu/viewdoc/download? doI=10.1.1.738.8f?74&rE;Jp=rep1&type=pdf> <DOI: 10.1269~/APhysPolA.126.603>; 5 pages.
International Search Report and Written Opinion issued for PCT/US2018/050507, dated Nov. 19, 2018, 18 pages.
International Preliminary Report on Patentability issued for PCT/US2018/050507, dated Mar. 26, 2020, 11 pages.

* cited by examiner

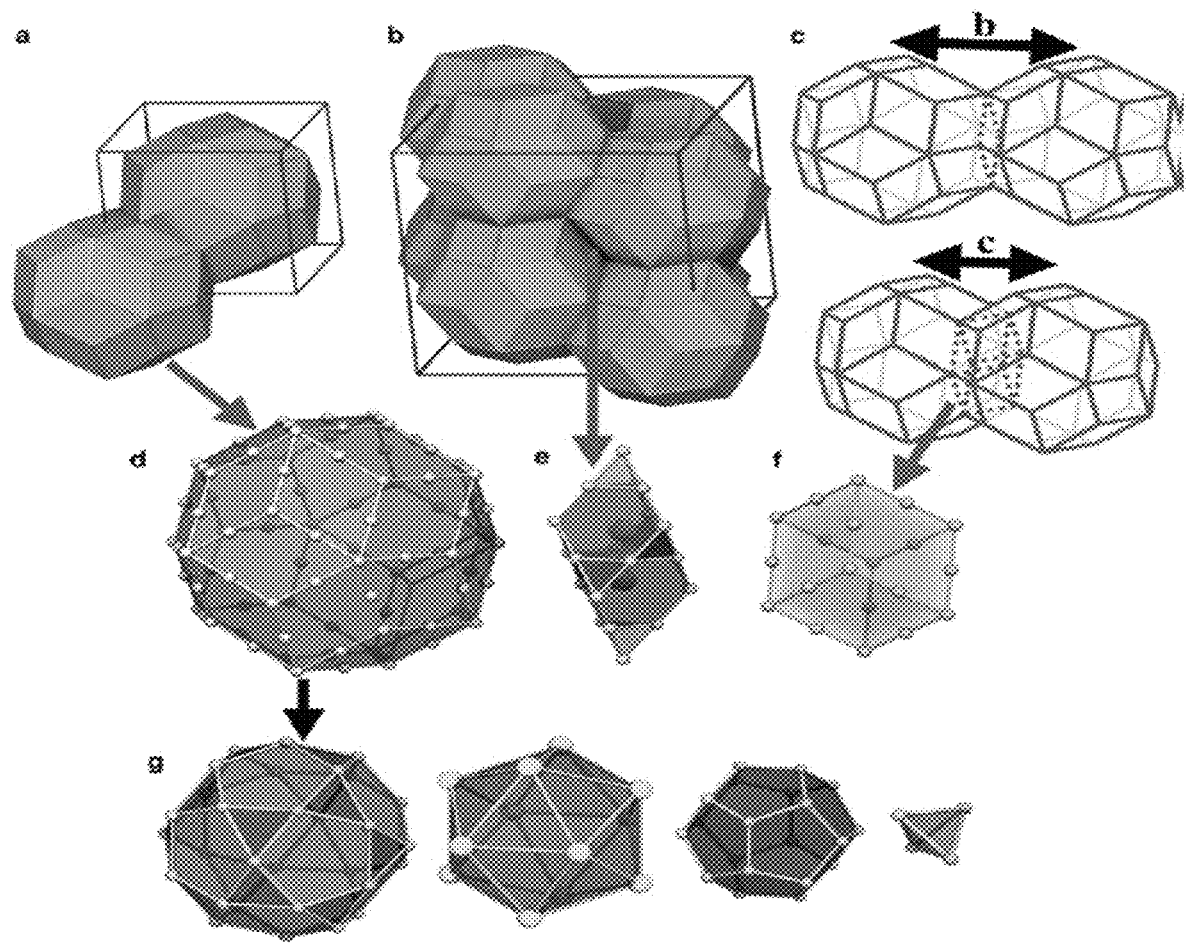
Fig. 4 : A Tsai-type QC approximant: [a-f]linkages between rhombic triacontahedron icosahedral shell; [g] inner icosahedral shells and finally the tetrahedral core,

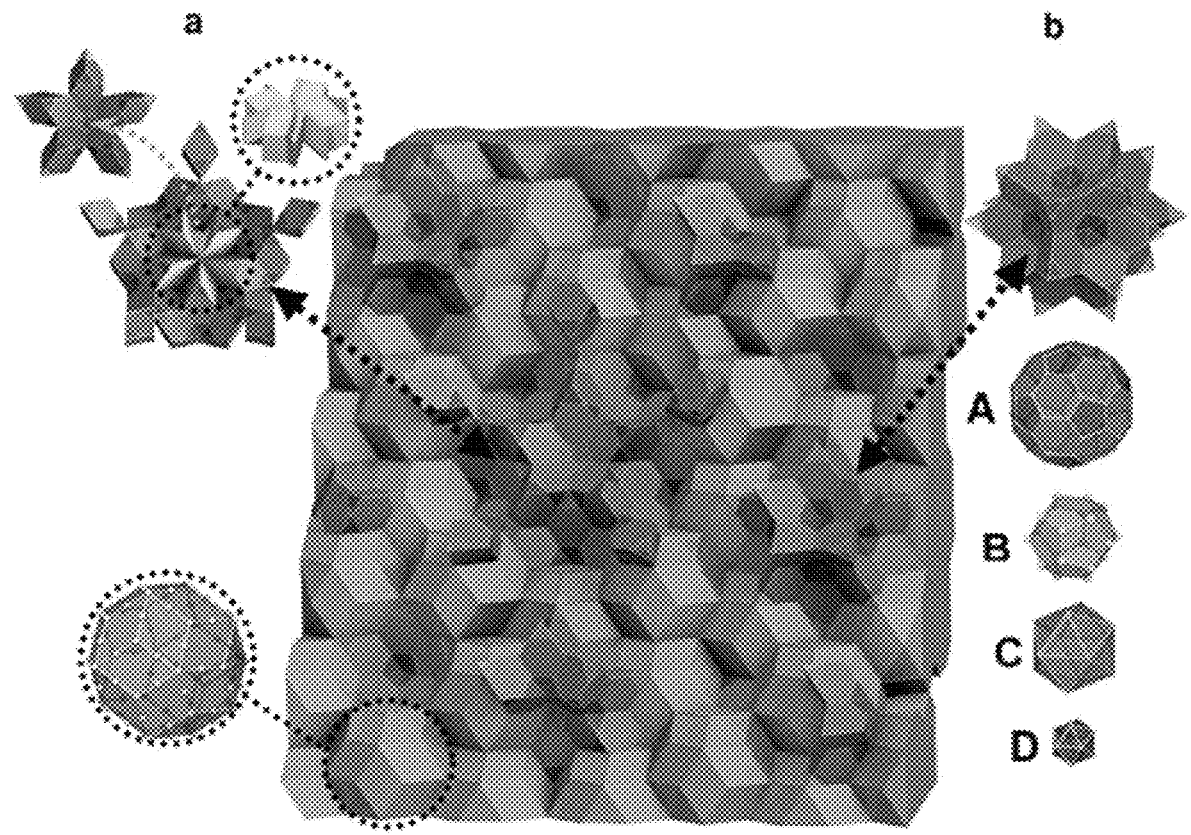
Figure 5 : Structure of i-Cd-Yb quasicrystal

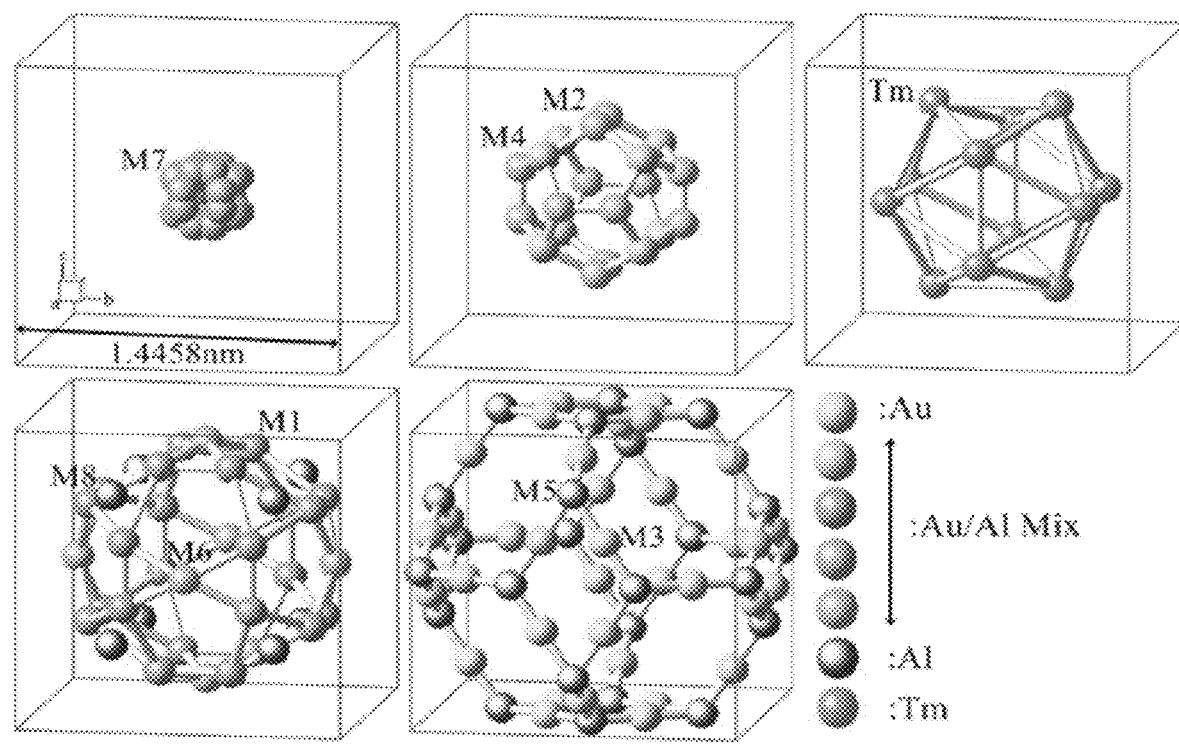
Fig. 6 A cuboctahedral atomic cluster M7 in a Tsai-type quasicrystal approximant cage.

TOPOLOGICAL QUANTUM COMPUTING, APPARATUS, SYSTEM AND METHOD

CROSS-REFERENCE TO RELATED APPLICATION

This application claims priority under 35 USC § 119(e) to U.S. Application No. 62/557,487, entitled "Quasicrystalline Topological Quantum Computing Apparatus, System, and Method," filed Sep. 12, 2017, the entirety of which is herein incorporated by reference.

TECHNICAL FIELD

Embodiments of the disclosure are generally related to quantum computing, including topological quantum computing.

BACKGROUND

Topological quantum computers are of potential interest for performing quantum computing. Topological quantum computers are widely acknowledged as one of the most difficult approaches to quantum computing hardware.

In theory, topological quantum computers would use quasiparticles (e.g., non-abelian anyons) as the basis of topological qubits. Information may be encoded as braids of the paths of the quasiparticles. In other words, the qubits are topological objects in which the quantum information is protected by the collective topological behavior of the system, making the topological qubits more robust to environmental fluctuations and more resistant to decoherence that conventional qubits.

There are numerous theoretical advantages to topological quantum computing, including greater robustness to environmental fluctuations and resistance to decoherence. This, in turn, may reduce error rates. An advantage of lower error rates is fewer extra quantum bits are required to error correct each qubit. This makes a topological quantum computer potentially more fault tolerant, scalable, and stable than quantum computers based on trapped quantum particles.

The most widely studied kinds of anyons are associated with chains of very cold electrons that are confined at the edge of a 2D surface. That is, the anyons are associated with two-dimensional quantum systems chilled to near absolute zero. One approach includes using semiconductors made of gallium arsenide (or similar semiconductor crystal materials) at a temperature of near absolute zero and subjected to strong magnetic fields. However, the experimental data so far is tenuous that such conventional semiconductor materials can be successfully used for topological quantum computing.

Thus, while there are many theoretical advantages to topological quantum computing, so far there are immense practical problems to implementing the hardware of a topological quantum computer.

Embodiments of this disclosure were developed in view of the above-described problems.

SUMMARY

A quantum computer utilizes a quasicrystal or quasicrystalline approximant material as the basis for qubits. In some embodiments, the quantum computer is a topological quantum computer. In one embodiment a quantum computer comprises a fault tolerant topological quantum computer based on qubits in a quasicrystal or quasicrystalline approximant material. In one embodiment, the quantum computer utilizes a quantum topological spin network formalism (TQFT) based on a quantum code. In one embodiment, the qubits are based on entangled spin states in the quasicrystal or quasicrystalline approximant material. In one embodiment, the material is a Tsai-type quasicrystalline approximant material. In one embodiment, the quasicrystal or quasicrystalline approximant material is selected to have anyonic properties. In one embodiment, the material is a quasicrystalline approximant and ensembles of atoms in the quasicrystalline approximant material comprise guest atomic clusters having a first symmetry within a cage structure having a second symmetry. In one embodiment, the qubits are quantum correlated network of fermionic tetrahedral cores across the bulk of the Tsai-type quasicrystalline approximant. In one embodiment, each qubit is quantum superposition of a finite set of energetically allowed molecular dipole spin orientations within the quasicrystal or quasicrystal approximant.

In one embodiment, each qubit is a single spin system and a controller selects a duration of a pulse at a resonant frequency to rotate a spin of the qubit to a selected angle.

In one embodiment, each qubit is a two spin system and the controller selects a duration of a pulse at a resonant frequency to rotate a spin of the qubit to a selected angle.

BRIEF DESCRIPTION OF THE DRAWINGS

This application contains at least one drawing executed in color. Copies of this application publication with color drawings will be provided by the Office upon request and payment of the necessary fee.

FIG. 4 illustrates aspects of a Tsai-type quasicrystalline approximant material in accordance with an embodiment.

FIG. 5 illustrates an example of an i-Cd—Yb quasicrystal in accordance with an embodiment.

FIG. 6 illustrates another example of a Tsai-type quasicrystalline approximant material in accordance with an embodiment.

DETAILED DESCRIPTION

Embodiments of this disclosure utilize quasicrystal or quasicrystalline approximant materials to form the basis of a quantum computer, with several detailed examples being provided for quasicrystalline approximant materials. Quasicrystal and quasicrystalline approximant materials have special material properties that the inventor of the present application has recognized can be adapted for use in quantum computing, including topological quantum computing. In the following discussion, various references are cited as aids for understanding the background materials science and physics. However, when a reference is cited, it will be understood that it is also incorporated by reference.

Quasicrystals are a special phase of matter that was discovered in the 1980s. A quasicrystal is a quasiperiodic structure that is ordered but lacks translational symmetry. A quasicrystal approximant is a state of matter in which "local" regions having quasicrystal symmetry are embedded within a larger crystal. It is a periodic version of a quasicrystal in which the same atomic clusters are packed periodically. The substructures or the structural tiles of approximants are the same as those of the corresponding quasicrystals but are arranged periodically in approximants whereas a true quasiperiodic arrangement is observed in quasicrystals. In other words, approximants reproduce within their unit cells a portion of the aperiodic structure. Approximants often have large lattice parameters in the directions in which the corresponding quasicrystal is quasiperiodic.

Quasicrystals and quasicrystalline approximant materials have a variety of special properties that can be adapted for use in a quantum computer, as described below in more detail.

Figure 1:
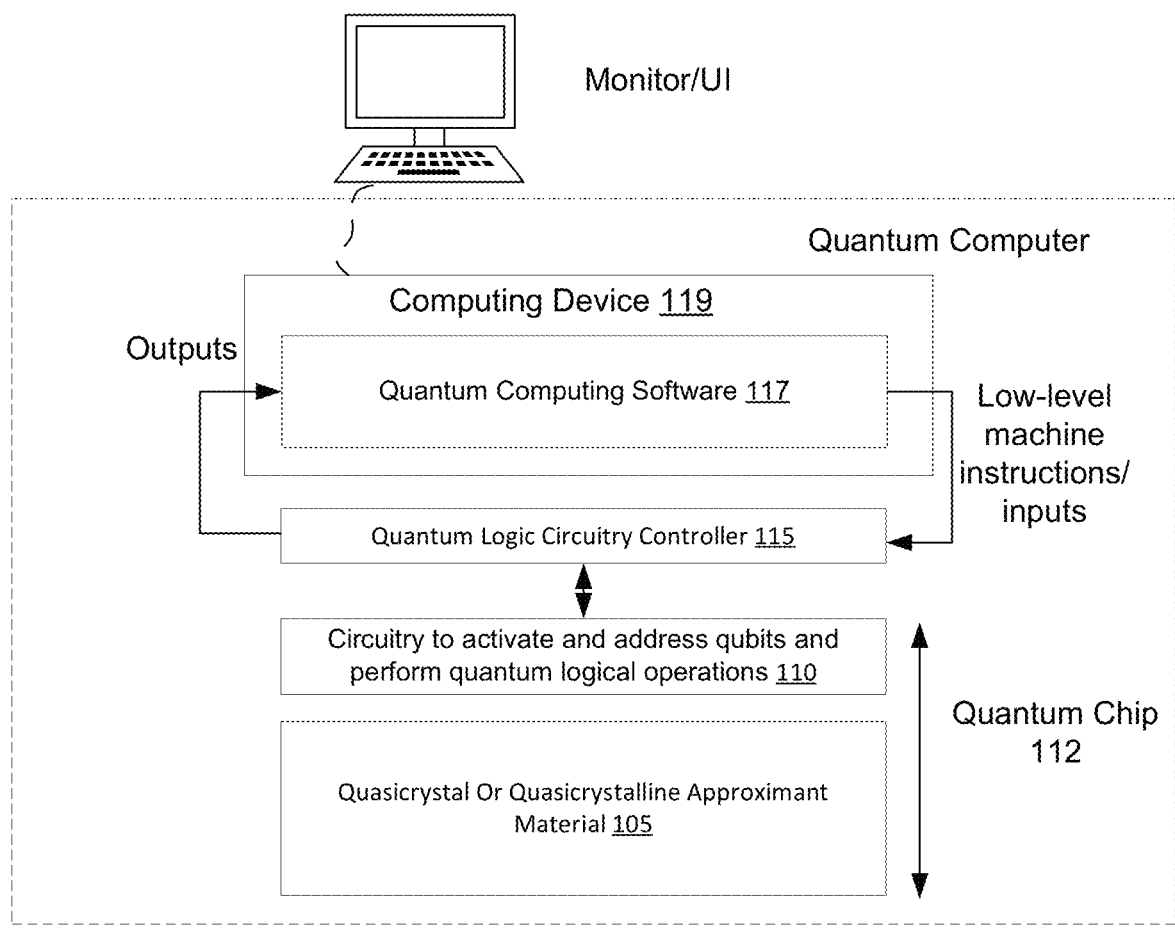
FIG. 1 is a block diagram of a quantum computer utilizing a quasicrystal or quasicrystalline approximant material in accordance with an embodiment.

FIG. 1 is a block diagram of a quantum computer in accordance with an embodiment. A quasicrystal or quasicrystalline approximant material 105 is used to perform quantum computing and forms the basis of a quantum chip 112. That is, the qubits exist, at a quantum mechanical level, in the material 105. Examples of the material 105 are described below in more detail, including specific quasicrystalline approximant materials having materials properties chosen for quantum computing applications.

Control circuitry 110 to address and activate qubits and perform quantum logical operations 110 using the material 105 is provided. As one non-limiting example, the control circuitry 110 may include features to generate local electromagnetic signals in material 105, as described below in more detail. The material 105 and control circuitry 110 together form a quantum chip 112. The quantum chip 112 may, for example, be implemented to have all of the support circuitry to control quantum logic operations for a set of inputs and outputs. For example, in one embodiment the quantum chip 112 is designed to support a selected number, N, of qubits (e.g., 30, 40, 50 or more qubits) and includes all of the control circuitry necessary to address and activate the qubits, and perform quantum logical operations on a set of inputs and generate a set of outputs.

In one embodiment, a controller 115 controls the control circuitry 110. For example, the controller may include a microcontroller, microprocessor, or electronic logic circuitry to select actions implemented by the control circuitry 110. As illustrative but non-limiting examples, the controller 155 may select the duration the duration and strength of pulsed currents used to generate local magnetic fields by control circuitry 110. The division of operations between the control circuity 110 and the controller 115 may be implemented in different ways. As one example, the controller 115 may receive what corresponds to low-level machine instructions/inputs and generates even lower-level instructions/commands to activate portions of control circuity 110, such as activating/deactivating electromagnetic control signals in different regions of material 105. However, it will also be understood that in some embodiments the controller 115 is integrated with the control circuitry 112. In some embodiments, the control circuity 110 and controller 115 includes a processor and memory to perform operations such as receiving machine level instructions and initial inputs for one or more quantum logical operations, addressing/activating qubit and quantum logic gates, reading outputs of the quantum logic operations, and (optionally) performing post-processing of outputs. In one embodiment, the results of a quantum logical operation are provided to another computer, such as computing device 119.

At a higher level, a quantum computing task may require a sequence of quantum logical operations to be performed. In one embodiment, quantum computing software 117 operating in the computing device 119 determines a logical operation sequence for the controller and receives outputs from the circuity that read the qubits. The computing device 119 may be a conventional computer operating quantum computing software 117. For example, a variety of companies, such as the Microsoft Corporation, are developing the equivalent of "Software" for managing quantum devices. The Microsoft LIQUI|>™ software architecture includes a programming language to translate a quantum algorithm written in the form of a high-level program into low-level machine instructions for a quantum device. For example a user interface of the computing device 119 and quantum computing software 117 may be provided for a user to create a high level program to perform a quantum computing task using the quantum chip 112.

Figure 2:
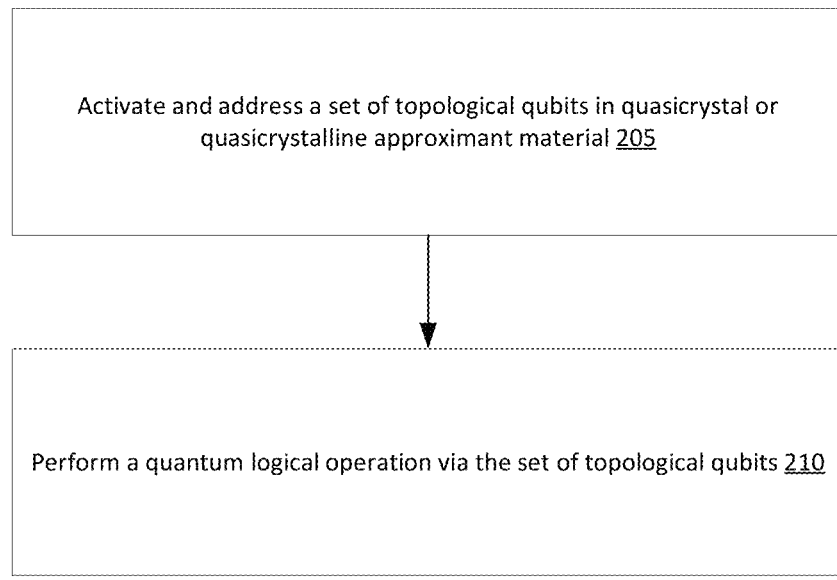
FIG. 2 is a flowchart illustrating a method of performing quantum logical operations in accordance with an embodiment.

FIG. 2 illustrates a method for performing an individual quantum logical operation in accordance with an embodiment. Referring to the flow chart of FIG. 2, the quantum logic control circuitry 110 activates and addresses a set of qubits of the quasicrystal or quasicrystal approximant material in block 205. This results in block 210 in the performance of a quantum logical operation via the set of qubits. In one embodiment, the qubits are topological qubits. In practice, the quantum computer would go through a sequence of quantum logical operations, in which a quantum logical operation is performed, the outputs are read, and the resulting outputs are used to generate inputs for the next quantum logical operation, and so on.

Figure 3:
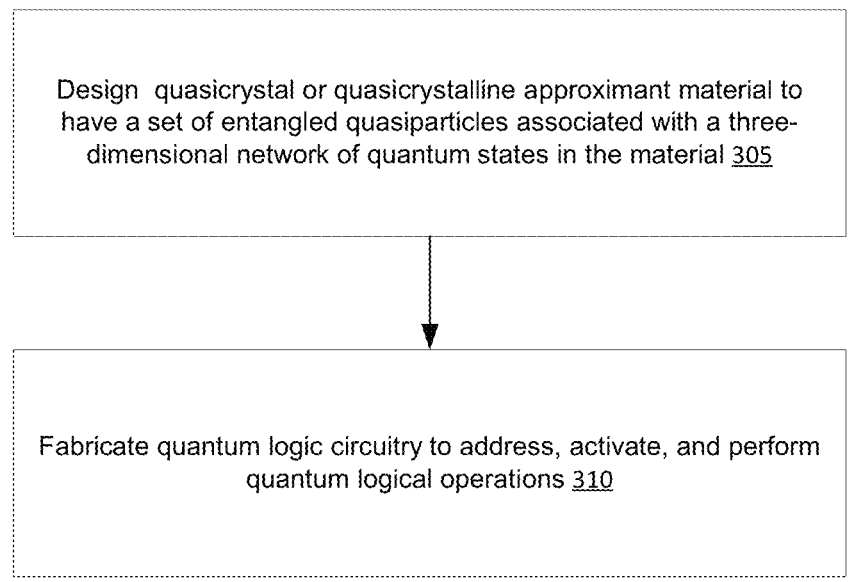
FIG. 3 is a flowchart illustrating a method of design and fabrication of quantum logical circuity in accordance with an embodiment.

FIG. 3 illustrates an example of a method of designing and fabricating a quantum computer in accordance with an embodiment. In block 305, a quasicrystal or quasicrystalline approximant material is designed and fabricated to have a set of entangled quasiparticles associated with a three-dimensional network of quantum states in the material. As described below in more detail, quasicrystals and quasicrystal approximant materials have a variety of property that are useful for making a quantum computer.

In block 310, quantum gates and quantum logic circuity are fabricated to address, activate, and perform quantum logical operations on qubits in the material.

In one embodiment, the quantum computer comprises a fault tolerant topological quantum computer based on atomic scale qubits using quasicrystal or quasicrystalline approximant materials. Topological quantum field theory (TQFT) is the common framework. Universality and Fibonacci anyons emerge in this new quasicrystal/quasicrystalline approach.

In one embodiment, the topological quantum computer utilizes a quantum topological spin network formalism, a form of TQFT based on a quantum Baysian code. It is fault tolerant [See, e.g., R. Aschheim, S. Femmam, and M. F. Zerarka. New "Graphiton" Model: a Computational Discrete Space, Self-Encoded as a Trivalent Graph. *Computer and Information Science*, 5(1):2, December 2011], where geometric language expression on the topological substrate restores organized quantum coherent states without global synchronization.

Specifically, a self-correcting code [See, e.g., R. Mosseri. Geometrical approach to SU(2) navigation with Fibonacci anyons. *Journal of Physics A: Mathematical and Theoretical*, 41(17):175302, May 2008. arXiv: 0801.2860] is inherent to the model, where one can say the atomic hardware and software are one in the same or imply one another [See, e.g., D. Litinski, M. S. Kesselring, J. Eisert, and F. von Oppen.

Combining Topological Hardware and Topological Software: Color Code Quantum Computing with Topological Superconductor Networks. arXiv: 1704.01589 [cond-mat, physics:quant-ph], April 2017. arXiv: 1704.01589].

This approach can benefit the problems of scalability, coherence time and finding the upper limit of optimal entanglement entropy in a quantum computer [D. Wecker and K. M. Svore. LIQUi|>: A Software Design Architecture and Domain-Specific Language for Quantum Computing. arXiv: 1402.4467 [quant-ph], February 2014. arXiv: 1402.4467].

One aspect is that quasicrystals are a topological phase of matter ([See, e.g., D.-T. Tran, A. Dauphin, N. Goldman, and P. Gaspard. Topological Hofstadter Insulators in a Two-Dimensional Quasicrystal. *Physical Review B*, 91(8), February 2015. arXiv: 1412.0571; and M. A. Bandres, M. C. Rechtsman, and M. Segev. Topological Photonic Quasicrystals: Fractal Topological Spectrum and Protected Transport. *Phys. Rev. X*, 6(1):011016, February 2016]).

The inventor has recognized that this implies that quasicrystals are not only a topological phase of matter but that they have intrinsic properties that makes them useful for spintronic approaches to quantum computation ([See, e.g., Y. Xu, I. Miotkowski, C. Liu, J. Tian, H. Nam, N. Alidoust, J. Hu, C.-K. Shih, M. Z. Hasan, and Y. P. Chen. Observation of topological surface state quantum Hall effect in an intrinsic three-dimensional topological insulator. *Nat Phys*, 10(12):956-963, December 2014]).

This includes the association of quasicrystals with the quantum Hall effect ([See, e.g., F. Flicker. 2014: Quasicrystals, Charge Ordering|Centre for Nanoscience and Quantum Information|University of Bristol. School of Physics, University of Bristol, November 2014. Centre for Nanoscience and Quantum Information; and Y. E. Kraus, Z. Ringel, and O. Zilberberg. Four-Dimensional Quantum Hall Effect in a Two-Dimensional Quasicrystal. *Physical Review Letters*, 111(22), November 2013. arXiv: 1302.2647]).

In one embodiment, the quasicrystal or quasicrystalline approximant materials are especially designed and fabricated for topological quantum computing. They are further fabricated into quantum computing elements, such as quantum logic gates. A quantum computing system may comprise a set of topological qubits and quantum logic gates based on entangled quantum states in the quasicrystal or quasicrystalline approximant.

In one embodiment, a quasicrystalline approximant is designed to have ensembles of atoms selected to improve a rank of entanglement entropy. In one embodiment, a tetrahedral atomic cluster is selected and implemented as a guest in a host cage. However, it will be understood that the invention is not limited to this particular implementation. More generally, the quasicrystal or quasicrystalline approximant may be nanoengineered to use other guest/host implementations.

I. Tetrahedral Molecule, Cuboctahedral, and Other Quasicrystal Embodiments

Several more detailed examples will now be discussed for the design and use of the quasicrystal or quasicrystalline approximant material as non-limiting example. Some of the following analysis relies on the inventor's extensive research in piecing together different insights from the research literature to arrive at a new understanding of the potential for quasicrystal/quasicrystalline approximant materials to be used in quantum computers.

One embodiment uses tetrahedral atomic clusters in a quasicrystal approximant in order to improve the rank of entanglement entropy. Tetrahedral molecules can be entangled in structures such as magnons ([See, e.g., J. Romhányi, J. v. d. Brink, and I. Rousochatzakis. Entangled tetrahedron ground state and excitations of the magnetoelectric skyrmion material Cu$\_2\$OSeO\$\_3\$. *Physical Review B*, 90(14), October 2014. arXiv: 1403.4081]).

A Heisenberg-type Hamiltonian of magnons interacting in a crystal has been proposed ([See, e.g., P. Y. Portnichenko, J. Romhányi, Y. A. Onykiienko, A. Henschel, M. Schmidt, A. S. Cameron, M. A. Surmach, J. A. Lim, J. T. Park, A. Schneidewind, D. L. Abernathy, H. Rosner, J. v. d. Brink, and D. S. Inosov. Magnon spectrum of the helimagnetic insulator Cu2oseo3. *Nature Communications*, 7:10725, February 2016]).

Exotic states of entanglement are known to exist in quasicrystalline states of matter ([See, e.g., F. Igloi, G. Roosz, and Y.-C. Lin. Nonequilibrium quench dynamics in quantum quasicrystals. *New Journal of Physics*, 15(2): 023036, February 2013. arXiv: 1210.7328]).

The dynamic of the "hopping" tetrahedron in a quasicrystal approximant (QCA) has been reported ([see, e.g., H. Euchner, T. Yamada, H. Schober, S. Rols, M. Mihalkovic, R. Tamura, Tsutomu Ishimasa, and M. d. Boissieu. Ordering and dynamics of the central tetrahedron in the 1/1 Zn 6 Sc periodic approximant to quasicrystal. *J. Phys.: Condens. Matter*, 24(41):415403, 2012; and T. Yamada, H. Euchner, C. P. Gómez, H. Takakura, R. Tamura, and M. d. Boissieu. Short- and long-range ordering during the phase transition of the Zn 6 Sc 1/1 cubic approximant. *J. Phys.: Condens. Matter*, 25(20):205405, 2013]).

At very low temperature, where the jumping becomes strongly correlated across the bulk of the material, it may be atomic tunneling. The phenomena of atomic tunneling has been reported in quasicrystals ([See, e.g., V. Dubinko, D. Laptev, and K. Irwin. Catalytic mechanism of LENR in quasicrystals based on localized anharmonic vibrations and phasons. arXiv:1609.06625 [physics], August 2016. arXiv: 1609.06625; and B. I. Ivlev. The Euclidean resonance and quantum tunneling. *Physical Review A*, 66(1), July 2002. arXiv: quant-ph/0202145]).

For example, Bert et al observed that: " . . . tunneling states seem to be intrinsic to the quasicrystal structure," ([See, e.g., F. Bert, G. Bellessa, A. Quivy, and Y. Calvayrac. Tunneling states in a single-grain Al—Cu—Fe quasicrystal. *Phys. Rev. B*, 61(1):32-35, January 2000]).

In one embodiment, quantum gates are formed that satisfy the quantum gate conditions of di Vicenzo [(See, e.g., D. P. DiVincenzo and IBM. The Physical Implementation of Quantum Computation. *Fortschritte der Physik*, 48(9-11): 771-783, September 2000. arXiv: quant-ph/0002077)]. In some embodiments, the quantum gates may use some selected aspects of approaches developed for non-quasicrystal materials [(See, e.g., M. S. Garelli. *Theoretical model for the realization of quantum gates using interacting endohedral fullerene molecules*. Thesis, Âc M. S. Garelli, 2006; and C. Ju, D. Suter, and J. Du. An endohedral fullerene-based nuclear spin quantum computer. Physics Letters A, 375(12): 1441-1444, Marcj 2011.)]

In one embodiment, a Tsai type quasicrystal approximant is modified for use in quantum computing [(See, e.g., H. Takakura, C. P. Gómez, A. Yamamoto, M. De Boissieu, and A. P. Tsai. Atomic structure of the binary icosahedral Yb—Cd quasicrystal. *Nat Mater*, 6(1):58-63, January 2007)]. In one embodiment, the underlying physical basis of the qubit is a tetrahedral atomic cluster in the icosahedral cages of the Tsai type approximant.

FIG. 4 illustrates an example of a Tsai-type quasicrystalline approximant with sub-figures a-f showing show linkages between rhombic triacontahedron icosahedral shell and subfigure g shows inner icosahedral shells and the tetrahedral core. FIG. 5 shows an example of the structure of an i-Cd—Yb quasicrystal. Here, the qubit would be associated with quantum states of the tetrahedral core of the Tsai quasicrystal.

In an alternate version, the core can be cuboctahedral [(See, e.g., K. Tanaka, Y. Tanaka, T. Ishimasa, M. Nakayama, S. Matsukawa, K. Deguchi, and N. Sato. Tsai-Type Quasicrystal and Its Approximant in Au—Al—Tm Alloys. *Acta Physica* Polonica A, 126(2):603-607, August 2014)]. FIG. 6 illustrates an example of a cuboctahedral atomic cluster M7 in a Tsai-type quasicrystal approximant cage. The same figure applies to the Al—Pd—Sc 1/1 with the first icosahedrally symmetric shell of the Tsai-type quasicrystal approximant consisting of Al and Pd with occupancy of 0.333.

More generally, other guest-host systems could be used, where typically the guest atomic cluster has a different symmetry than its cage.

One can also consider a qubit in this framework to participate as a quantum correlated network of fermionic tetrahedral cores across the bulk of the approximant. An analysis by the inventor indicates that this system has controllable quasiparticles emerging at low temperatures with anyonic properties that allow implementation of a Fibonacci anyon based universal quantum computer.

It will also be understood in the following discussions that other that other types of quasicrystal and quasicrystalline approximants that have the same general functional aspects, for quantum computing, are within the scope of the present disclosure.

1. Tetrahedral Qubit Dynamic

1.1 Physical System Model

In one embodiment, the qubit is modeled at the molecular scale with the tetrahedral 4-atom-cluster. Such a qubit would not be based on electron or nuclear spin but rather the quantum superposition of a finite set of energetically allowed molecular dipole spin orientations. Of course, this small tetrahedral molecule is the simplest shape in 3D. The atoms in this qubit core tetrahedral cluster can be Cd (represented in the shaded regions in FIG. 4). The interatomic distance is 3.3 Å and the radius of the tetrahedron is 2.0 Å. The intercluster distance is 15.66 Å in b-linkage, and 13.56 Å in c-linkage, for the 1/1 cubic approximant $Y bCd_6$.

1.2 Hamiltonian

In one example, we first define the Hamiltonian for two qubits, that is two neighboring tetrahedra. Suppose the mutual interaction between the spins of two neighboring tetrahedral clusters is dominated by a quantum spin glass class of dipole-dipole interaction and that the exchange interaction is negligible:

$$H = g(r)(\sigma_1 \otimes \sigma_2 - 3(\sigma_1 \cdot \vec{n}) \otimes (\sigma_2 \cdot \vec{n}))$$  Eq. (1)

where $$g(r) = \frac{\mu_0 \mu_B^2}{2\pi r^3}$$

is the dipolar coupling constant. The Hamiltonian simplifies if ~n is chosen parallel to the x-axis:

$$H = g(r)(\sigma_{z1} \otimes \sigma_{z2} + \sigma_{y1} \otimes \sigma_{y2} - 2\sigma_{x1} \otimes \sigma_{x2}) = \qquad \text{Eq. (2)}$$

$$g(r)\begin{pmatrix} 1 & 0 & 0 & 3 \\ 0 & -1 & -1 & 0 \\ 0 & -1 & -1 & 0 \\ -3 & 0 & 0 & 1 \end{pmatrix}$$

Submitted to an external static magnetic field along the z-axis, with Larmor frequencies $\omega_{0,1}=\mu_B B_{0,1}$ at node 1 and $\omega_{0,2}=\mu_B B_{0,2}$ at node 2, the Hamiltonian emerges as:

$$H_{DD}=g(r)(\sigma_{z1}\otimes\sigma_{z2}+\sigma_{y1}\otimes\sigma_{y2}2\sigma_{x1}\otimes\sigma_{x2})-(\omega_{0,1}\sigma_{z1}-\omega_{0,2}\sigma_{z2}) \qquad \text{Eq. (3)}$$

It has been shown that two thin wires along the z-axis holding a current of 0.3 A in opposite directions, enclosing the two clusters, generates a magnetic field gradient between $B_{0,1}=-120$ mT and $B_{0,2}=+120$ mT at x positions separated from 12 Å, which can be pulsed, canceled or reverted to control the spins via the Hamiltonian.

The 2-qubit Hamiltonian may be extended in the Tsai AC 1/1 QC approximant to a 7-qubit Hamiltonian by cycling the second qubit in all six cubic directions. In the Tsai AC 2/1, the qubits have 10 nearest neighbors, each sharing three rhombic faces of the rhombic triacontahedron supercage structure, with vector coordinates that are Dirichlet integers. At the level of this model, the simplification of the wavefunction assimilates the tetrahedral molecule as an electron, in the same manner that the nitrogen atom does in the aforementioned model ([See, e.g., M. S. Garelli. *Theoretical model for the realization of quantum gates using interacting endohedral fullerene molecules*. Thesis, Âc M. S. Garelli, 2006]), where the simplification does not spoil the results. However, it will be understood that quantum molecular dynamic simulations including the real atoms in the QCA may also be performed for more precise results.

1.3 Entanglement

In one embodiment, the entanglement of two qubits is computed by evaluating the concurrence of the standard basis state y|00⟩+x|01⟩+p|11⟩ which is Q(ψ)=2|x*z*−y*p*|/(xx*+yy*+zz*+pp*). Solving the Schroedinger equation $i\delta_t|\psi\rangle = H|\psi\rangle$ for ψ(t) = (y, x, z, p) where $$H = \alpha\begin{pmatrix} 1 & 0 & 0 & -3 \\ 0 & -1 & -1 & 0 \\ 0 & -1 & -1 & 0 \\ -3 & 0 & 0 & 1 \end{pmatrix} + \beta\begin{pmatrix} \mu_1 & 0 & 0 & 0 \\ 0 & \mu_2 & 0 & 0 \\ 0 & 0 & -\mu_2 & 0 \\ 0 & 0 & 0 & -\mu_1 \end{pmatrix},$$

$\alpha = g(r)/G$, $\beta = 1/G$, $\mu_1 = -\mu(B_1 + B_2)$, $\mu_2 = -\mu(B_1 - B_2)$, $\mu = \frac{1}{2}$, $B_1 = 4.25697 \times 10^{-7}$, $B_2 = 4.25179 \times 10^{-7}$, $G = 4.25690 \times 10^{-7}$ and -continued $g(r) = 1.33155 \times 10^{-9}$ yield to a concurrence $C(\psi(t_{max})) = 0.88$ at $t_{max} = 9.1$ ns.

In contrast, the shortest decoherence time $T_2 \cong 250$ µs is of the order of $10^4$ times bigger letting the possibility for such a number of gate operations on the entangled qubits. However, a further extension of the entanglement to more than two qubits, as suggested by the quasicrystal approximant geometry, to 7 to 11 nearest neighbors would further stabilize the system.

1.4 Control and Formation of Quantum Logic Gates

Referring again to FIG. 1, in a quantum computer embodiment, there is control circuitry 110 to address and activate qubits and perform quantum logical operations. The control circuitry may be used with the quasicrystal approximants described above to address and activate the qubit correlations as well as to form quantum logic gates.

The control circuitry 110 can be based on approaches used in other types of materials, such as using wires to apply an electromagnetic field, such as modifying the control circuitry used in endohedral fullerenes ([See, e.g., M. S. Garelli. *Theoretical model for the realization of quantum gates using interacting endohedral fullerene molecules.* Thesis, Âc M. S. Garelli, 2006]) to our QCA architecture. The control circuitry can be designed to dynamically change the qubit connection between different neighbors and establish multi-qubit correlations. That is, the control circuitry may be used to address and activate the qubit correlations.

Quantum logic gate functions may be implemented using selective electromagnetic pulses to, for example, establish a resonance magnetic field, as described below in more detail.

For example, atom chip technology (or other approaches) may be used to form two spaced apart parallel wires carrying the same current to generate a magnetic field gradient. For example, as previously described, It has been shown that two thin wires along the z-axis holding a current of 0.3 A in opposite directions, enclosing the two clusters, generates a magnetic field gradient between $B_{0,1} = -120$ mT and $B_{0,2} = +120$ mT at x positions separated from 12 Å, which can be pulsed, canceled or reverted to control the spins via the Hamiltonian.

A complete quantum computer system may, for example, also include the circuitry to generate any static or pulsed currents needed to control the spins via the Hamiltonian.

However, it will be understood that more generally other examples of control circuitry and control systems may be used change the qubit connection, establish multi-qubit correlations, and form quantum logic gates.

1.4.1 Single-Spin System: Single-Qubit Gates

For a single spin system, a static magnetic field $B_0$ is applied along the z-axis to activate the qubit.

Then the spin 1/2 value can be manipulated by applying an additional magnetic field rotating in the (x,y) plane, characterized by a resonance frequency $\omega_m = 2\omega_0$, a phase shift $\varphi$ and an amplitude $B_m$ $H_m = (-\mu_B B_m(\cos(\omega_m t + \varphi)\sigma_x - \sin(\omega_m t + \varphi)\sigma_y)$  Eq. (4)

In a rotated frame, this Hamiltonian is:

$H_{m,rot} = -\mu_B B_m(\cos((\omega_m - 2\omega_0)t + \varphi)\sigma_x - \sin((\omega_m - 2\omega_0)t + \varphi)\sigma_y$  Eq. (5)

In the resonance condition, it becomes time-independent $H = \mu_B B_m(\cos(\varphi)\sigma_x - \sin(\varphi)\sigma_y)$, and the time evolution is:

$U(t) = e^{-iHt/\hbar} = e^{-i\mu_B B_m(\cos(\varphi)\sigma_x - \sin(\varphi)\sigma_y)t}$  Eq. (6)

Accordingly, by selecting the duration of the pulse at the resonant frequency, we can rotate the spin of the qubit by any desired angle to perform a quantum logic gate operation. For example, a rotation of $$\frac{\pi}{2}$$

around the y axis $$U = e^{-i\frac{\pi}{4}\sigma_y}$$

is realized with $$\phi = \frac{\pi}{2} \text{ and } t = \frac{\pi}{4}\mu_B B_m.$$

This time evolution should be of a higher order than the spin-dipolar interaction to occur efficiently.

1.4.2 Two-Spin System: Two-Qubit Gates 2-qubit interactions occur naturally under the dipole-dipole Hamiltonian $H_{DD}$ and the relaxation time has been computed by be on the order of 10 nano-seconds. The π-gate has the evolution:

$$G_\pi = \sqrt{t}\, e^{-i\frac{\pi}{4}\sigma_{z1}} e^{-i\frac{\pi}{4}\sigma_{z2}} U\left(t = \frac{\pi}{16\, g(r)}\right)$$  Eq. (7)

The CNOT-gate has the evolution:

$$CNOT = t e^{-i\frac{\pi}{2}\sigma_{z1}} e^{i\frac{\pi}{4}\sigma_{y2}} G_\pi e^{-i\frac{\pi}{4}\sigma_{y2}}$$  Eq. (8)

1.4.3 Full Range of Quantum Gating Operation for Universal Quantum Computer While several examples of quantum gates have been provided for the purposes of illustration, it will be understood that the underlying physics indicates that the full range of quantum gates may be formed to implement a universal topological quantum computer.

1.4.3 Scalability

While an embodiment of a quantum gate has been provided, it will be understood that a quantum computer may include a set of quantum gates. That is, it will be understood the number of quantum gates may be scaled up to achieve a quantum computer having substantial computing power.

2. TQFT Implementation

Some comparisons are now provided between topological quantum computing embodiments of this disclosure, based on Topological quantum field theory, and other quantum computing technologies.

Physical qubits have fast quantum decoherence. A quantum error correction code consists of implementing reliable logical qubits via circuits of multiple physical qubits.

A recent report ([See, e.g., A. Fruchtman and I. Choi. Technical Roadmap for Fault-Tolerant Quantum Computing. Technical report, NQIT Network Quantum Information Technologies, Oxford, UK, October 2016]) analyzes the present situation. It states there are two very different cases:

Superconductor type Qubit technologies, like
Ion Traps
Superconducting Qubits
Nitrogen-Vacancy Centers in Diamond
Photonics
Spin Qubits in Silicon
Topological Qubits (generally made of three Quasi-Particles of non-abelian anyons)

Of course, there are two fundamental types of quantum computer, circuit-based and adiabatic.

For circuit-based: Quantum error correction can only be applied by operations on qubits which have a precision (non-failure percentage) greater than a threshold. In one approach, the "surface code" this threshold is 99%. And 9 qubits are required to achieve quantum error correction. But the Eastin-Knill theorem states that some gates are not compatible with quantum error correction. This means gates are required for some computing, and there is a way to make them reliable by adding a huge overhead of another kind of qubit named magic states. For example, at least 10 billion of magic states are needed to factorize a 1000-bit number.

For adiabatic: There has been very little work done on Error Correction codes.

In contrast, an embodiment of the present invention implements topological qubits that are based on a quasicrystal/quasicrystalline approximant related architecture. A topological quantum computer is very stable because the information encoding is non-local ([See, e.g., C. Nayak, S. H. Simon, A. Stern, M. Freedman, and S. D. Sarma. Non-Abelian Anyons and Topological Quantum Computation. *Reviews of Modern Physics*, 80(3):1083-1159, September 2008. arXiv: 0707.1889]), living in the braiding architecture of the atomic ensembles themselves. Such topological systems would be immune to decoherence due to local perturbations. Qubits are made of several quasi-particles from the quasicrystalline associated atomic arrays and are stabilized by non-local objects called "empires." For example, the quasicrystalline spin network is a spin network formalism in 3-space. In an embodiment of our quantum topological network, we do not require an outside error-correction code as is required in unstable qubits formalisms used in other approaches. This architecture is emergent from first principles and possesses inherent fault-tolerance for the processing of quantum information.

3. Fibonacci Anyons and the QSN Architecture

Fibonacci anyons are defined on a TQFT. They have a built-in error correction ([See, e.g., S. Burton, C. G. Brell, and S. T. Flammia. Classical Simulation of Quantum Error Correction in a Fibonacci Anyon Code. arXiv:1506.03815 [quant-ph], June 2015. arXiv: 1506.03815; and M. Esmaeili and M. Esmaeili. A Fibonacci-polynomial based coding method with error detection and correction. *Computers & Mathematics with Applications*, 60(10):2738-2752, November 2010]). In this case, fault-tolerance can be achieved at the physical level instead of using outside quantum error-correcting codes. By way of analogy, the quasicrystalline architecture of the Quantum Spin Network (QSN) is not only reliable, it is also highly efficient. Some aspects may be explained using a hybrid 2D-3D model of Majorana fermions ([See, e.g., G. K. Brennen and J. K. Pachos. Why should anyone care about computing with anyons? *Proceedings of the Royal Society of London A: Mathematical, Physical and Engineering Sciences*, 464(2089):1-24, January 2008]). Each can be non-realized or realized in one of two parities, encoding a trit. In this possibility space, a restricted set of realized states occurs. Higher level structure emerges, specially where 20 tetrahedra meet at one vertex and don't share volume but only faces. The number of possible planes for all the faces is reduced to 10, which gives a very interesting ground state, still generating Quasi-Crystalline icosahedral symmetry.

In one embodiment, the quasicrystal structure emerges when we organize, in a nearest-neighbor network, specific high valence vertices according to a Fibonacci based code. 3D node as quasi-particles hold a surface code correlated to a rhombic triacontahedron. The entanglement, via a 30-element flux, with 3D neighbor nodes organized in tetrahedral form defines the qubits in this quantum topological net. We use the edges $Z_3$ parafermions, which are an enriched version of Fibonacci anyons.

4. Methods of Use for Quantum Computing

It will be understood that methods of forming qubits and performing quantum logic gate operations in embodiments of the topological quantum computer described in this application are contemplated. This includes solving computational problems using the topological quantum computer. Thus, embodiments of the present invention include methods of performing quantum computing using a quasicrystal or quasicrystalline approximant material, including methods of operating a quantum logic gate or set of quantum logic gates.

5. Fabrication of Quasicrystal and Quasicrystalline Approximant Materials

Various fabrication approaches may be utilized. The design of the materials structure (the quasicrystal or quasicrystalline approximant) structure may be empirically determined by testing a large number of different candidate materials. However, in one embodiment, the materials structure may be designed, based on principles of quasicrystals. Growth and fabrication of the desired materials structure may then be performed using quasicrystal fabrication techniques, such as selecting the composition of major materials and dopants and selecting a time/temperature cycling to "quench" in a quasicrystal phase of matter having the desired energy well structure. Details of the process may be empirically tested, such as varying the time/temperature cycle.

For example, consider the case of quasicrystalline approximants, such as some of the Tsai-type QCAs previously discussed. For example, a large number of different quasicrystalline approximant materials could, in principle, be fabricated and tested. However, in one embodiment the quasicrystalline approximant is designed and then fabricated. Similarly, the composition of major material and dopants and time/temperature cycle may be selected to quench in the desired quasicrystalline approximant structure.

5. Alternate Embodiments

It will be understood that alterations, modifications, variations, and equivalent structures are contemplated as being within the scope of the present invention. While examples have been provided of materials forming topological states of matter based on a quasiperiodic ordering of the material, it will be understood that many alterations, modifications, variations, and equivalents are contemplated. While examples of techniques to address, activate, and form quantum gate operations on qubits have been described, it will be understood that alterations, modifications, variations, and equivalent structures are contemplated in the design and operation of a topological quantum computer.

6. Additional High-Level Aspects of Design Selection of Parameters of Quasicrystal or Quasicrystalline Approximant For Topological Quantum Computer Quasicrystals and quasicrystalline approximant materials are a comparatively new class of materials that have not previously been considered for use in topological quantum computers. It will be understood from the above-described examples that more general design principles are within the scope of the present invention.

One aspect of selecting design parameters is that is not just the fact that quasicrystals or quasicrystalline approximants are being used. It is not just that guest/host systems may be used in one embodiment. The particular materials are preferably designed and optimized for use in a practical topological quantum computer implementation.

One aspect is that the quasicrystal or quasicrystalline approximant is designed with desirable properties for a topological quantum computer. This includes aspects of the manner in which entangled quantum states are formed related to forming a topological phase of matter in which topological qubits can be used to perform quantum computing.

As described above, one way to understand the use of a particular materials structure in topological quantum computers is to analyze the Hamiltonian for a particular system.

Another way to understand the issues is by considering some general selection parameters of the quasicrystal or quasicrystalline approximant for a high performance topological quantum computer.

For example, in a material having a guest-host system, the choice of the atomic cluster (cluster atomic composition and size) and the cage structure may be useful to create a defined set of quantum states for each atomic cluster within a cage. For example, selecting specific cluster geometries (e.g., tetrahedra) within a cage having a different symmetry is one way to define a set of quantum states for the cluster. Moreover, this selection may be made to form defined sets of quantum states for the particular purpose of performing quantum computing.

Some selections of the cluster atoms may also be more effective than others in regards to having a defined set of quantum states as well as having a material that is responsive to electromagnetic fields for qubit activation and quantum logic operations.

Additionally, aspects of the quantum state may be selected to have particular qualities and characteristics useful for topological quantum computing. For example, as previously discussed, in one embodiment, one way to understand one embodiment of the quasicrystal/quasicrystalline approximant materials is as quantum superposition of a finite set of energetically allowed molecular dipole spin orientations. There is an interaction of neighboring clusters (e.g., tetrahedra). The Hamiltonian is based on mutual interaction between the spins of two neighboring clusters. However, this in turn will depend in part on the intercluster separation and the selection of the cluster/cage parameters.

The inter-cluster separation is thus also an important parameter that may be selected in the design of the material. The inter-cluster separation may affect entanglement of quantum states of different clusters. Thus, the design of the material may be selected to provide a great degree of control of the inter-cluster separation in three dimensions.

For example, the example of FIG. 4 has atoms in a qubit core tetrahedral cluster that are Cd, the interatomic distance is 3.3 Å the radius of the tetrahedron is 2.0 Å and the intercluster distance is 15.66 Å in b-linkage, and 13.56 Å in c-linkage, for the 1/1 cubic approximant Y $bCd_6$. However, it would be understood that different results might be obtained for a different selection of cluster atoms with a substantially different (smaller or greater) intercluster distance. For example, in this example if the intercluster separation was hypothetically increased by two times (i.e., 31.12 Å, 27.12 Å), it might affect some aspects of the entanglement. Clearly if the intercluster separation was extremely large (e.g., four times as large, or 62.24 Å and 54.24 Å) then the large separation between clusters may deleteriously affect the interaction of neighboring clusters and hence the entanglement. Alternatively, if a different cluster was used (e.g., different atom type, different number of atoms in the cluster, or different symmetry and quantum states of cluster in cage), it might also have deleterious effects.

Additionally, as previously discussed, the number of interacting neighbors for a qubit is another consideration. But this, in turn, may depend on details of the design related to the interactivity of neighbors at a quantum level.

Additionally, the design of the quasicrystal or quasicrystalline approximant may be selected such that a three-dimensional network of quantum states of clusters is created.

In a practical topological quantum computer, the number of possible gate operations within a decoherence time is another consideration. In a particular example above, $T_2 \cong 250$ µs is of the order of $10^4$ times bigger letting the possibility for such a number of gate operations on the entangled qubits. However, it would be understood that changes in the quasicrystal or quasicrystalline approximant design may affect those results. That is, another aspect of a practical design is designing the quasicrystal/quasicrystalline approximant to support a desired minimum number of quantum gate operations on the qubits, which in turn may be affected by aspects of the design selection of parameters of the quasicrystal or quasicrystalline approximant.

In practice, some general criteria may be used to exclude many quasicrystal and quasicrystalline approximant possibilities.

In particular, in practice some selections of guest atom clusters, guest-host symmetries, and ranges of intercluster distances may be expected to be more effective than others in the context of a topological quantum computer. Principles of quasicrystal and quasicrystalline approximant geometry and quantum mechanics may be used to identify general parameters of materials likely to have useful characteristics for topological quantum computers. This is in addition to performing detailed quantum mechanical and empirical studies of individual materials.

The choice of the cluster, cage, and intercluster separation also relates to issues regarding whether the material can, using practical electromagnetic fields, activate qubits and perform quantum logic operations of a topological quantum computer.

As a practical consideration, an "ideal" topological quantum computer would preferably operate within realistic electromagnetic field strengths (e.g., magnetic field strength, magnetic field gradients, and RF pulsing) to address and activate qubits and make compact and reliable quantum gates. For example, conventional miniature wire structures have limits on the amount of current (current density) that they can sustain over extended periods of time for reliable operation and hence there are limits with current technology on practical magnetic field strength, magnetic field gradients, and other electromagnetic field parameters for compact quantum gates using such wire structures, such as the two-wire structure described above.

Thus, it will be understood that a practical topological quantum computer can be considered to utilize a general class of quasicrystal and quasicrystalline approximant materials that satisfy some general practical criteria for use in topological quantum computers. Additional optimization may be performed based on experimental studies or via quantum mechanical calculations or approximations.

7. References

The Following References are each hereby incorporated by reference:

[1] R. Aschheim, S. Femmam, and M. F. Zerarka. New "Graphiton" Model: a Computational Discrete Space, Self-Encoded as a Trivalent Graph. *Computer and Information Science*, 5(1):2, December 2011.

[2] M. A. Bandres, M. C. Rechtsman, and M. Segev. Topological Photonic Quasicrystals: Fractal Topological Spectrum and Protected Transport. *Phys. Rev. X*, 6(1): 011016, February 2016.

[3] F. Bert, G. Bellessa, A. Quivy, and Y. Calvayrac. Tunneling states in a single-grain Al—Cu—Fe quasicrystal. *Phys. Rev. B*, 61(1):32-35, January 2000.

[4] G. K. Brennen and J. K. Pachos. Why should anyone care about computing with anyons? *Proceedings of the Royal Society of London A: Mathematical, Physical and Engineering Sciences*, 464(2089):1-24, January 2008.

[5] S. Burton, C. G. Brell, and S. T. Flammia. Classical Simulation of Quantum Error Correction in a Fibonacci Anyon Code. arXiv: 1506.03815 [quant-ph], June 2015. arXiv: 1506.03815.

[6] D. P. DiVincenzo and IBM. The Physical Implementation of Quantum Computation. *Fortschritte der Physik*, 48(9-11):771-783, September 2000. arXiv: quant-ph/0002077.

[7] V. Dubinko, D. Laptev, and K. Irwin. Catalytic mechanism of LENR in quasicrystals based on localized anharmonic vibrations and phasons. arXiv:1609.06625 [physics], August 2016. arXiv: 1609.06625.

[8] M. Esmaeili and M. Esmaeili. A Fibonacci-polynomial based coding method with error detection and correction. *Computers & Mathematics with Applications*, 60(10):2738-2752, November 2010.

[9] H. Euchner, T. Yamada, H. Schober, S. Rols, M. Mihalkovic, R. Tamura, Tsutomu Ishimasa, and M. d. Boissieu. Ordering and dynamics of the central tetrahedron in the 1/1 Zn 6 Sc periodic approximant to quasicrystal. *J. Phys.: Condens. Matter*, 24(41):415403, 2012.

[10] F. Flicker. 2014: Quasicrystals, Charge Ordering-|Centre for Nanoscience and Quantum Information|University of Bristol. School of Physics, University of Bristol, November 2014. Centre for Nanoscience and Quantum Information.

[11] A. Fruchtman and I. Choi. Technical Roadmap for Fault-Tolerant Quantum Computing. Technical report, NQIT Network Quantum Information Technologies, Oxford, UK, Oct. 2016.

[12] M. S. Garelli. *Theoretical model for the realization of quantum gates using interacting endohedral fullerene molecules. Thesis, Âc M. S. Garelli*, 2006.

[13] F. Igloi, G. Roosz, and Y.-C. Lin. Nonequilibrium quench dynamics in quantum quasicrystals. *New Journal of Physics*, 15(2):023036, February 2013. arXiv: 1210.7328.

[14] B. I. Ivlev. The Euclidean resonance and quantum tunneling. *Physical Review A*, 66(1), July 2002. arXiv: quant-ph/0202145.

[15] C. Ju, D. Suter, and J. Du. An endohedral fullerene-based nuclear spin quantum computer. *Physics Letters A*, 375(12):1441-1444, March 2011.

[16] Y. E. Kraus, Z. Ringel, and O. Zilberberg. Four-Dimensional Quantum Hall Effect in a Two-Dimensional Quasicrystal. *Physical Review Letters*, 111(22), November 2013. arXiv: 1302.2647.

[17] D. Litinski, M. S. Kesselring, J. Eisert, and F. von Oppen. Combining Topological Hardware and Topological Software: Color Code Quantum Computing with Topological Superconductor Networks. arXiv: 1704.01589 [cond-mat, physics:quant-ph], April 2017. arXiv: 1704.01589.

[18] R. Mosseri. Geometrical approach to SU(2) navigation with Fibonacci anyons. *Journal of Physics A: Mathematical and Theoretical*, 41(17):175302, May 2008. arXiv: 0801.2860.

[19] C. Nayak, S. H. Simon, A. Stern, M. Freedman, and S. D. Sarma. Non-Abelian Anyons and Topological Quantum Computation. *Reviews of Modern Physics*, 80(3):1083-1159, September 2008. arXiv: 0707.1889.

[20] P. Y. Portnichenko, J. Romhânyi, Y. A. Onykiienko, A. Henschel, M. Schmidt, A. S. Cameron, M. A. Surmach, J. A. Lim, J. T. Park, A. Schneidewind, D. L. Abernathy, H. Rosner, J. v. d. Brink, and D. S. Inosov. Magnon spectrum of the helimagnetic insulator Cu2oseo3. *Nature Communications*, 7:10725, Februayr 2016.

[21] J. Romhânyi, J. v. d. Brink, and I. Rousochatzakis. Entangled tetrahedron ground state and excitations of the magneto-electric skyrmion material $Cu\$\_2\$OSeO\$\_3\$$. *Physical Review B*, 90(14), October 2014. arXiv: 1403.4081.

[22] H. Takakura, C. P. Gomez, A. Yamamoto, M. De Boissieu, and A. P. Tsai. Atomic structure of the binary icosahedral Yb—Cd quasicrystal. *Nat Mater*, 6(1):58-63, January 2007.

[23] K. Tanaka, Y. Tanaka, T. Ishimasa, M. Nakayama, S. Matsukawa, K. Deguchi, and N. Sato. Tsai-Type Quasicrystal and Its Approximant in Au—Al—Tm Alloys. *Acta Physica Polonica A*, 126(2):603-607, August 2014.

[24] D.-T. Tran, A. Dauphin, N. Goldman, and P. Gaspard. Topological Hofstadter Insulators in a Two-Dimensional Quasicrystal. *Physical Review B*, 91(8), February 2015. arXiv: 1412.0571.

[25] D. Wecker and K. M. Svore. LIQUi|>: A Software Design Architecture and Domain-Specific Language for Quantum Computing. arXiv:1402.4467 [quant-ph], February 2014. arXiv: 1402.4467.

[26] Y. Xu, I. Miotkowski, C. Liu, J. Tian, H. Nam, N. Alidoust, J. Hu, C.-K. Shih, M. Z. Hasan, and Y. P. Chen. Observation of topological surface state quantum Hall effect in an intrinsic three-dimensional topological insulator. *Nat Phys*, 10(12):956-963, December 2014.

[27] T. Yamada, H. Euchner, C. P. Gómez, H. Takakura, R. Tamura, and M. d. Boissieu. Short- and long-range ordering during the phase transition of the Zn 6 Sc 1/1 cubic approximant. *J. Phys.: Condens. Matter,* 25(20):205405, 2013.

[28] Quantum Walk on a Spin Network and the Golden Ratio as the Fundamental Constant of Nature," by K. Irwin et al, Minkowsy Inst. Intl. Conf. on the nature and orientation of spacetime, 2017 Proceedings, the contents of which are hereby incorporated by reference.

[29] "ENCODING GEOMETRIC FRUSTRATION IN TETRAHEDRAL PACKING WITH GAPS, DISCRETE CURVATURE, DISTORTION OR TWISTING" Fang Fang, Richard Clawson, and Klee Irwin, March 2017, published in Research Gate.

[30] "An Icosahedral Quasicrystal and E8 Derived Quasicrystals", Fang Fang, Klee Irwin, Research Gate (2016)

What is claimed is:

1. A quantum computer, comprising:
a fault tolerant topological quantum computer based on qubits in a quasicrystal or quasicrystalline approximant material wherein the quasicrystal or quasicrystalline approximant material is a Tsai-type quasicrystalline approximant material.

2. The quantum computer of claim 1, wherein the fault tolerant topological quantum computer utilizes a quantum topological spin network formalism based on a quantum code.

3. The quantum computer of claim 1, wherein the qubits are based on entangled spin states in the quasicrystal or quasicrystalline approximant material.

4. A topological quantum computing device, comprising:
a quasicrystal or quasicrystalline approximant material configured to form qubits, wherein each qubit comprises a plurality of quasiparticles of the quasicrystal or quasicrystalline approximant material, wherein the quasicrystal or quasicrystalline approximant material is a Tsai-type quasicrystalline approximant material.

5. The topological quantum computing device of claim 4, wherein the quasicrystal or quasicrystalline approximant material is a spin network.

6. The topological quantum computing device of claim 4, wherein the qubits comprise entangled quantum states of a topological spin network of the quasicrystal or quasicrystalline approximant material.

7. The topological quantum computing device of claim 4, wherein the quasicrystal or a quasicrystalline approximant material comprises ensembles of atoms selected based on an entanglement entropy.

8. A topological quantum computing device, comprising:
a quasicrystal or quasicrystalline approximant material configured to form qubits, wherein each qubit comprises a plurality of quasiparticles of the quasicrystal or quasicrystalline approximant material, wherein the quasicrystal or quasicrystalline approximant material is a quasicrystalline approximant and ensembles of atoms in the quasicrystalline approximant material comprise guest atomic clusters having a first symmetry within a cage structure having a second symmetry.

9. The topological quantum computing device of claim 8, wherein the quasicrystal or quasicrystalline approximant material comprises a Tsai-type quasicrystal approximant having a guest atomic cluster within a cage structure.

10. The topological quantum computing device of claim 9, wherein the qubits are quantum correlated network of fermionic tetrahedral cores across a bulk of the Tsai-type quasicrystalline approximant.

11. A topological quantum computing device, comprising:
a quasicrystal or quasicrystalline approximant material configured to form qubits, wherein each qubit comprises a plurality of quasiparticles of the quasicrystal or quasicrystalline approximant material, wherein each qubit is quantum superposition of a finite set of energetically allowed molecular dipole spin orientations within the quasicrystal or quasicrystal approximant material.

12. The topological quantum computing device of claim 4, wherein each qubit is formed from a plurality of quasiparticles in a quasicrystalline spin network.

13. A topological quantum computing device, comprising:
a quasicrystal or quasicrystalline approximant material configured to form qubits, wherein each qubit comprises a plurality of quasiparticles of the quasicrystal or quasicrystalline approximant material, wherein information in the qubits is encoded in non-local braiding of atomic ensembles of the quasicrystal or quasicrystal approximant material.

14. The topological quantum computing device of claim 4, wherein each qubit is a single spin system and a controller selects a duration of a pulse at a resonant frequency to rotate a spin of the qubit to a selected angle.

15. The topological quantum computing device of claim 4, wherein each qubit is a two-spin system and a controller selects a duration of a pulse at a resonant frequency to rotate a spin of the qubit to a selected angle.

16. A method of performing topological quantum computing, comprising:
generating a qubit formed from a plurality of quasiparticles of a quasicrystal or quasicrystal approximant material; and
performing a quantum computation using the qubit, wherein information in the qubit is encoded in non-local braiding of atomic ensembles of the quasicrystal or quasicrystal approximant material.

17. The method of claim 16, wherein the qubit is formed from a plurality of quasiparticles in a quasicrystalline spin network.

18. The method of claim 16, wherein the qubit is a single spin system, the method further comprising selecting a duration of a pulse at a resonant frequency to rotate a spin of the qubit to a selected angle.

19. The method of of claim 16, wherein the qubit is a two-spin system and the method further comprising selecting a duration of a pulse at a resonant frequency to rotate a spin of the qubit to a selected angle.

* * * * *